United States Patent
Straw et al.

(10) Patent No.: US 8,867,312 B1
(45) Date of Patent: Oct. 21, 2014

(54) METHOD FOR COMPRESSING THE DYNAMIC RANGE OF MEASURED SIGNALS

(71) Applicants: Timothy B. Straw, Narragansett, RI (US); Michael J. O'Bara, North Kingstown, RI (US); Stephen A. Caldwell, Warren, RI (US)

(72) Inventors: Timothy B. Straw, Narragansett, RI (US); Michael J. O'Bara, North Kingstown, RI (US); Stephen A. Caldwell, Warren, RI (US)

(73) Assignee: The United States of America as represented by the Secretary of the Navy

( * ) Notice: Subject to any disclaimer, the term of this patent is extended or adjusted under 35 U.S.C. 154(b) by 0 days.

(21) Appl. No.: 14/172,092

(22) Filed: Feb. 4, 2014

(51) Int. Cl.
*G01V 1/00* (2006.01)
(52) U.S. Cl.
CPC ..................................... *G01V 1/001* (2013.01)
USPC .......................................................... 367/92
(58) Field of Classification Search
None
See application file for complete search history.

(56) References Cited

U.S. PATENT DOCUMENTS

| | | | |
|---|---|---|---|
| 5,625,697 A * | 4/1997 | Bowen et al. | 381/92 |
| 2004/0261120 A1 * | 12/2004 | Zhang et al. | 725/129 |
| 2009/0041202 A1 * | 2/2009 | McNeill et al. | 379/1.03 |
| 2011/0141845 A1 * | 6/2011 | Peacock et al. | 367/13 |

* cited by examiner

*Primary Examiner* — Luke Ratcliffe
*Assistant Examiner* — Hovhannes Baghdasaryan
(74) *Attorney, Agent, or Firm* — James M. Kasischke; Michael P. Stanley

(57) ABSTRACT

A sonar system is provided with the system having comparatively reduced power consumption, data bandwidth and data storage requirements. A sensor array of the system is configured to a sleep mode, low-resolution mode and high-resolution mode. In the sleep mode, all sonar sensors are configured in the mode and no acoustic signals are detected or processed. In the low-resolution mode, a limited number of sonar sensors are powered and acoustic signals received by the sensors are processed with reduced bandwidth and dynamic range, and then stored on a data storage device. In the high-resolution mode, the acoustic signals detected by the sonar sensors are processed with full signal bandwidth and dynamic range and then stored on the data storage device. A 10 bit mu-Law encoding scheme is used to reduce the amplitude scale of measurement or dynamic range of the digitized acoustic signals.

20 Claims, 11 Drawing Sheets

|  | LEGACY MODE (PRIOR ART) | LOW-RESOLUTION | HIGH-RESOLUTION |
|---|---|---|---|
| CHANNELS | ALL CHANNELS ACTIVE | 5:1 REDUCTION IN ACTIVE CHANNELS | ALL CHANNELS ACTIVE |
| DATA | 24 BIT | 8 BIT | 24 BIT |
| BANDWIDTH | 500 HZ | 100 HZ | 500 HZ |
| SAMPLE RATE | 1250 SPS | 250 SPS | 1250 SPS |
| DURATION | 24 HOURS | 24 HOURS - 100 SECONDS | 100 SECONDS |
| POWER CONSUMPTION | 100% | 10% | 100% |
| DATA RATE | 40 KB/SEC. | 0.73 KB/SEC | 40 KB/SEC. |
| DATA COLLECTED | 3398 MB | 61.7 MB | 3.9 MB |

FIG. 3

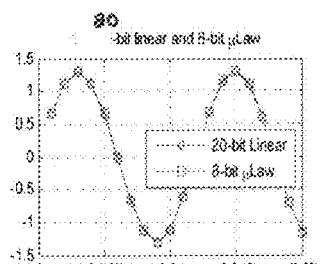
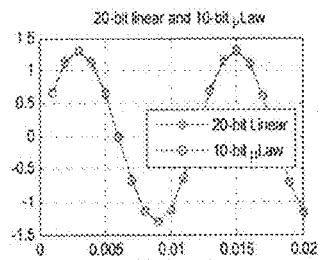
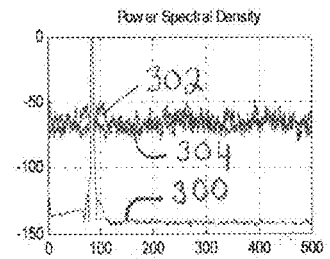
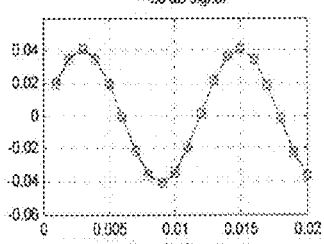
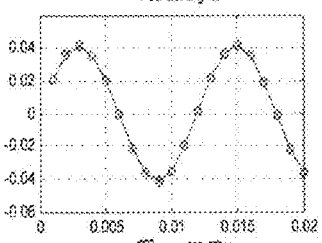
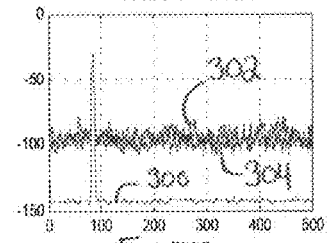
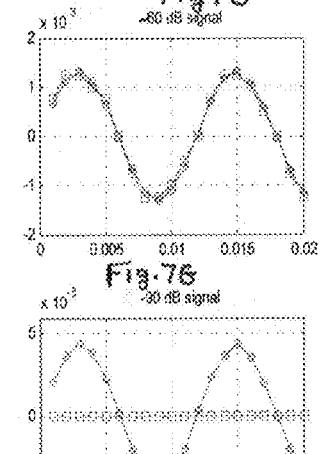
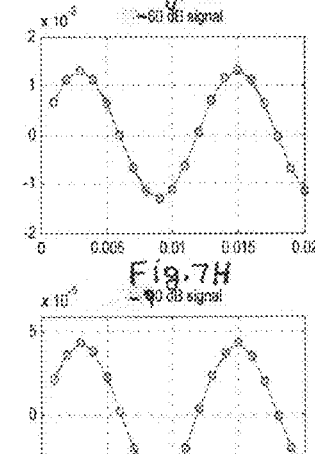
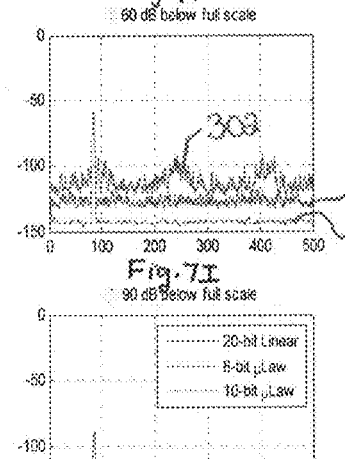
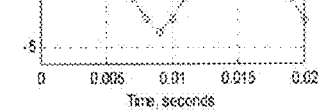
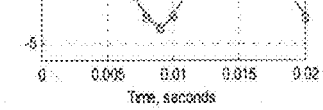
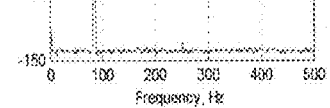
FIGS. 7A-L

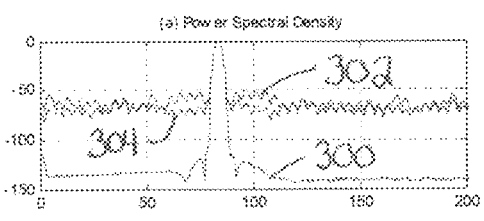
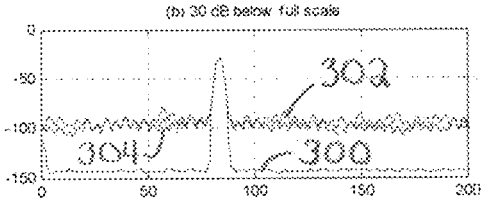
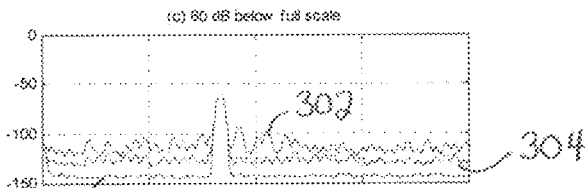
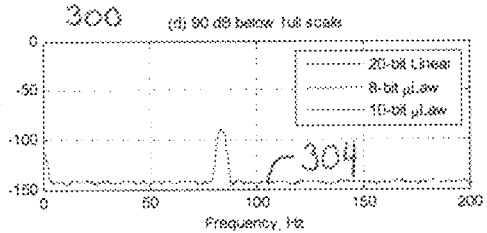
FIGS. 8A-D

FIGS. 9A-D

METHOD FOR COMPRESSING THE DYNAMIC RANGE OF MEASURED SIGNALS

STATEMENT OF GOVERNMENT INTEREST

The invention described herein may be manufactured and used by or for the Government of the United States of America for governmental purposes without the payment of any royalties thereon or therefor.

This application is a continuation-in-part of and claims the benefit of prior patent application; U.S. patent application Ser. No. 13/567,306 filed on Aug. 6, 2012 and entitled "Sonar Sensor Array and Method of Operating Same" by the common inventors, Timothy B, Straw, Michael J. Obara and Stephen A. Caldwell.

CROSS REFERENCE TO OTHER PATENT APPLICATIONS

None.

BACKGROUND OF THE INVENTION (1) Field of the Invention

The present invention generally relates to sonar sensor arrays and more particularly, to a method of use for a sonar sensor array that has reduced power consumption, bandwidth and data storage requirements.

(2) Description of the Prior Art

Acoustic sonar sensors are used for many purposes and in a variety of environments. For example, acoustic sonar sensors are used on surface ships and in underwater applications such as line arrays, submarines and unmanned undersea vehicles. Such acoustic sensors are used to detect ships, marine life, marine geology, and other underwater sound sources. The sonar sensors are typically fixed in either a linear arrangement or in a structure that conforms to a hull of a host vehicle.

Current acoustic and other type sonar sensors require a fixed amount of power to operate with the result of a fixed measurement data-rate for a given application. In some applications, the measured signal of interest is present for relatively short periods of time followed by relatively long periods of time in which there is no signal of interest. Sonar sensor arrays that are configured to continuously acquire and record sensor data consume significant amounts of electrical power and utilize large amounts of available memory.

In such sensor arrays, the sensors are constantly powered since signal monitoring continuously occurs. Therefore, the sensor arrays are very inefficient with the result of limited operating time for battery-powered systems wherein a finite amount of electrical energy is available. Furthermore, these existing sensor arrays are constricted by a data-playback restriction such that only a limited amount of playback bandwidth is available for a specific application.

SUMMARY OF THE INVENTION

Accordingly, it is general purpose and primary object of the present invention to provide a sonar sensor array and method of use that addresses the operational deficiencies of prior art sensor arrays.

To attain the objects described, the present invention is directed to a sonar sensor array that utilizes significantly less electrical power, bandwidth and data memory. The sensor array may be configured in any one of three operational modes depending on environmental conditions and programmed system parameters.

A first of the three modes is a sleep mode in which sonar sensors of the array are turned off (not powered) and no monitoring of acoustic signals occurs. The sleep mode is used when there are significantly long periods of time between appearances of targets. A second mode is a low-resolution mode in which a limited number of sonar sensors are activated and acoustic signals are sampled and digitized using reduced bandwidth and dynamic range. Digitized acoustic signal data is stored on a data storage device. A third mode is a high-resolution mode in which all sonar sensors are activated and acoustic signals are sampled and digitized with full bandwidth and full dynamic range. The digitized acoustic signal data is then stored in the data storage device.

In one embodiment, the sonar sensor array cycles between the low-resolution mode and the high-resolution mode wherein processing of the high-resolution mode does not occur unless processing of the low-resolution mode determines the presence of a target of interest. In another embodiment, the sonar sensor array cycles between the sleep mode and high-resolution mode. In such an embodiment, the sonar array system remains in the sleep mode for a predetermined amount of time and then shifts to low-resolution mode. If no acoustic energy representing a target is detected; the sensor reverts to sleep mode. If acoustic energy, representing a target, is detected; the sonar sensor array immediately shifts into high-resolution mode signal processing.

Thus, the present invention is directed to a sonar sensor array that comprises a plurality of sonar sensors, wherein each sensor can be configured to a powered mode in which the sensor detects acoustic signals or to a sleep mode in which the sensor receives no electrical power and does not detect acoustic signals.

The sonar sensor array further comprises a data acquisition device having a signal processor and a data storage device. The signal processor samples and digitizes the acoustic signals received by the sensors and the digitized signal data is stored on the storage device. The data acquisition device is configured to operate in a low-resolution mode of signal processing in which acoustic signals received by the sonar sensors are processed by the signal processor at reduced bandwidth and dynamic range, and then stored on the data storage device. The data acquisition device is also configured to operate in a high-resolution mode in which the acoustic signals received by the sonar sensors are processed by the full signal bandwidth and dynamic range and then stored on the memory device.

The sonar array system further comprises a control circuit for configuring the sonar sensors to the sleep mode or to the powered mode. The control circuit also configures the data acquisition device to the low-resolution mode or to the high-resolution mode depending upon the amplitude level of the detected acoustic signals and whether the detected acoustic signals indicate the presence of a target of interest. During the low-resolution mode, the control circuit configures a limited number of sonar sensors to the powered mode. During the high-resolution mode, the control circuit configures all of the sonar sensors to the powered mode.

In another embodiment, the present invention is directed to a method of processing acoustic signals with the steps of: being provided acoustic signals; sampling the provided signals at a sample rate to produce sampled acoustic signals; digitizing the sampled signals to produce digitized acoustic signals having a first predetermined format and a first amplitude scale of measurement; and compressing the digitized acoustic signals with a 10-bit mu-Law encoding scheme to produce compressed signals having a second amplitude scale of measurement. The method further comprises expanding the compressed signals to produce expanded digital signals having a second predetermined format and processing the expanded digital signals to extract target information.

BRIEF DESCRIPTION OF THE DRAWINGS

A more complete understanding of the invention and many of the attendant advantages thereto will be appreciated as the same becomes better understood by reference to the following detailed description when considered in conjunction with the accompanying drawings wherein corresponding reference characters indicate corresponding parts throughout the several views of the drawings and wherein:

FIG. 3 is a chart of the differences between a prior art legacy system and the present invention including both low resolution and high resolution modes of operation;

FIG. 7A is a graph based on simulated performance of 20-bit linear encoding and 8-bit mu-Law encoding showing amplitude characteristics at an input signal level of 0 dB relative to full scale;

FIG. 7B is a graph based on simulated performance of 20-bit linear encoding and 10-bit mu-Law encoding showing amplitude characteristics at an input signal level of 0 dB relative to full scale;

FIG. 7C is a graph based on simulated performance of 20-bit linear encoding, 8-bit mu-Law and 10-bit mu-Law encoding showing power spectral density characteristics at an input signal level of 0 dB relative to full scale;

FIG. 7D is a graph based on simulated performance of 20-bit linear encoding and 8-bit mu-Law encoding showing amplitude characteristics at an input signal level of −30 dB relative to full scale;

FIG. 7E is a graph based on simulated performance of 20-bit linear encoding and 10-bit mu-Law encoding showing amplitude characteristics at an input signal level of −30 dB relative to full scale;

FIG. 7F is a graph based on simulated performance of 20-bit linear encoding, 8-bit mu-Law and 10-bit mu-Law encoding showing power spectral density characteristics at an input signal level of −30 dB relative to full scale;

FIG. 7G is a graph based on simulated performance of 20-bit linear encoding and 8-bit mu-Law encoding showing amplitude characteristics at an input signal level of −60 dB relative to full scale;

FIG. 7H is a graph based on simulated performance of 20-bit linear encoding and 10-bit mu-Law encoding showing amplitude characteristics at an input signal level of −60 dB relative to full scale;

FIG. 7I is a graph based on simulated performance of 20-bit linear encoding, 8-bit mu-Law and 10-bit mu-Law encoding showing power spectral density characteristics at an input signal level of −60 dB relative to full scale;

FIG. 7J is a graph based on simulated performance of 20-bit linear encoding and 8-bit mu-Law encoding showing amplitude characteristics at an input signal level of −90 dB relative to full scale;

FIG. 7K is a graph based on simulated performance of 20-bit linear encoding and 10-bit mu-Law encoding showing amplitude characteristics at an input signal level of −90 dB relative to full scale;

FIG. 7I is a graph based on simulated performance of 20-bit linear encoding, 8-bit mu-Law and 10-bit mu-Law encoding showing power spectral density characteristics at an input signal level of −90 dB relative to full scale;

FIG. 8A is an expanded view of a portion of the power spectral density graph in FIG. 7C showing power spectral density from 0 to 200 Hz at an input signal level of 0 dB relative to full scale;

FIG. 8B is an expanded view of a portion of the power spectral density graph in FIG. 7F showing power spectral density from 0 to 200 Hz at an input signal level of −30 dB relative to full scale;

FIG. 8C is an expanded view of a portion of the power spectral density graph in FIG. 7I showing power spectral density from 0 to 200 Hz at an input signal level of −60 dB relative to full scale;

FIG. 8D is an expanded view of a portion of the power spectral density graph in FIG. 7L showing power spectral density from 0 to 200 Hz at an input signal level of −90 dB relative to full scale;

DETAILED DESCRIPTION OF THE INVENTION

Figure 1:
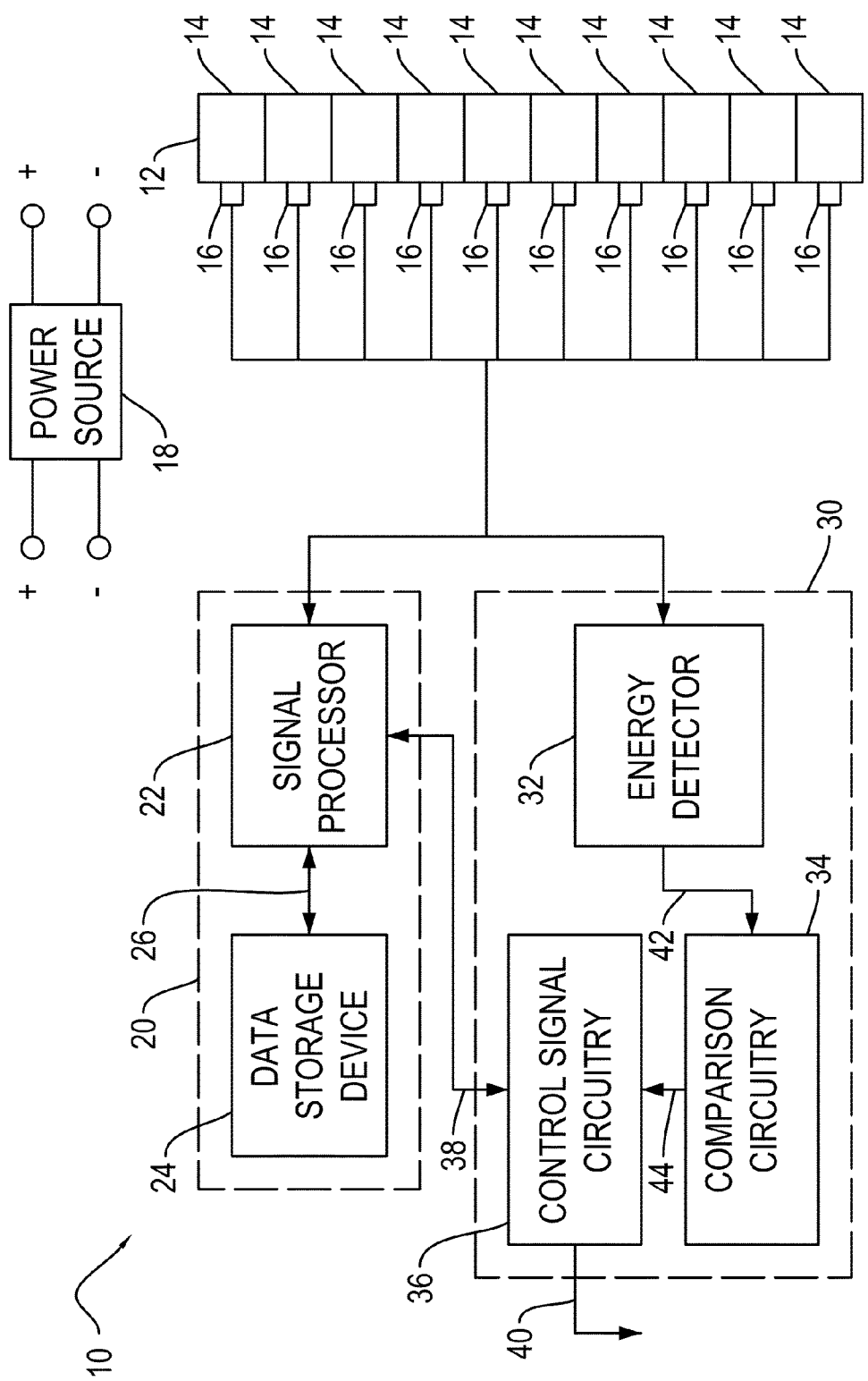
FIG. 1 is a block diagram of a sonar sensor array in accordance with one embodiment of the present invention including a line array, a data acquisition device, and a control circuit.

Referring to FIG. 1, there is shown a sonar system 10 in accordance with one embodiment of the present invention. The system 10 comprises a line array 12 that has a plurality of sonar sensors 14. Each sensor 14 has a corresponding electronic circuit 16 that contains a switch that, when closed, allows electrical power to be applied to the sensor so as to activate the sensor. When the sensor 14 is activated; the sensor is in the powered mode. When the switch is open, electrical power is removed from the sensor 14; thereby, turning off the sensor. In use, the array of sonar sensors 14 could be a line array or a planar array.

When the sensor 14 is off or deactivated; the sensor is in the sleep mode. Each electronic circuit 16 is capable of receiving a control signal that allows the switch to configure the corresponding sensor to the sleep mode or to the powered mode. Each circuit 16 includes an output port for providing the acoustic signals sensed by the sonar sensor 14. A power source 18 provides electrical power to the circuits 16 and other components of the array 12. The power source 18 is typically a battery of fixed capacity.

The sensor array system 10 further comprises a data acquisition device 20 which samples, digitizes and records signals received from the sensors 14. The acquisition device 20 comprises a signal processor 22 and a data storage device 24. The signal processor 22 is in data signal communication with the storage device 24 via a data bus 26. The signal processor 22 samples and digitizes acoustic signals.

In one embodiment, the signal processor 22 is programmed with algorithms such as Fast Fourier Transform or Discrete Fourier Transform. The storage device 24 may be a non-volatile memory or other suitable memory device. In a preferred embodiment, the data storage device 24 includes stored data relating to known target signatures or target characteristics. In such an embodiment, the signal processor 22 compares recently processed acoustic signals with pre-stored data that relates to known target signatures in order to determine if a particular target is or has been in the environment.

The data acquisition device 20 can be configured to a sleep mode in which some circuitry of the acquisition device is disabled to reduce electrical power consumption. In the sleep mode, no signal processing occurs and thus, no data storage space of the storage device 24 is used. When the data acquisition device 20 is configured to the sleep mode, all of the sonar sensors 14 are configured to the sleep mode with the result of significantly reducing power consumption.

The data acquisition device 20 can be configured to operate in a high-resolution mode. In the high-resolution mode, all channels (i.e., all of the sonar sensors 14) are in the active or powered mode and the signal processor 22 samples and digitizes acoustic signals with full signal bandwidth and full dynamic range. All data is then stored to the data storage device 24 for later use.

The data acquisition device 20 can be configured to a low-resolution mode. In the low-resolution mode, the electrical power and data record bandwidth are significantly reduced. In this mode, only a limited number of the sonar sensors 14 are powered. In one embodiment of the low-resolution mode, the signal bandwidth is reduced by reducing the signal sample rate, for example, by a factor of 5:1. In another embodiment of the low-resolution mode, a second data rate reduction is effected by compressing the amplitude scale of the measurement, for example, by converting 24-bit linear to 8-bit compounded resolution. This achieves a reduction by a factor of 3:1 in data rate.

The combination of reduced bandwidth and reduced amplitude resolution has an improvement in reduced data rate by a factor of 15:1 compared to the high-resolution mode. In the low-resolution mode, data volume is also further reduced by the utilization of only a limited number of sonar sensors 14 in the powered mode. This is because a line array of sensors 14 is typically designed with a physical spacing related to the upper design frequency of interest. The sonar sensor system 10 can be configured so that only every third, or every fourth, or every fifth, etc. one of the sonar sensors 14 is configured to the powered mode while the remaining sonar sensors are configured to the sleep mode. The reduction in signal bandwidth (by a factor of 5:1 by reducing the sampling rate in combination with using a limited number of powered sensors 14) results in an aggregate data-rate reduction by a factor of 45:1 to 75:1.

The low-resolution mode may be implemented by simultaneously reducing the sampling rate and compressing the amplitude scale of measurement. The signal processor 22 is programmable and can be configured to the sleep mode, low-resolution mode or high-resolution mode upon receipt of a signal from a control circuit 30. The sleep mode allows for a periodic time window between the high-resolution mode and the low-resolution mode, or between successive periods of high-resolution modes, in order to further reduce electrical power and is effective when the signal of interest is slowly varying over the time span of several cycles of the high-resolution mode, low-resolution mode and sleep mode.

The control circuit 30 comprises an energy detector 32, comparison circuitry 34 and control signal circuitry 36. A data bus 38 is in data signal communication with the signal processor 22 and the control signal circuitry 36. A data bus 40 is in data signal communication with the circuits 16 which are associated with the sonar sensors 14. The control signal circuitry 36 issues digital control signals by the data bus 38 to change the mode of the signal processor 22 to the sleep, low-resolution or high-resolution modes.

In a preferred embodiment, the control signal circuitry 36 is programmable and has a data storage device such as a read-only-memory or other type of non-volatile memory for storing pre-programmed sequences of operation. The signal circuitry 36 also outputs digital control signals over the data bus 40 to configure the sonar sensors 14 to the sleep mode or to the powered mode. The energy detector 32 detects acoustic signals received by powered sonar sensors 14 and outputs a signal waveform 42 that represents the detected acoustic signals.

In one embodiment, the energy detector 32 comprises a frequency-selective band-pass filter and an averaging circuit. The averaging circuit produces the slowly varying signal waveform 42 that is proportional to the input of the band-pass filter. The pass-band of the bandpass filter is adjusted to a band of frequencies associated with a target of interest.

The comparator circuitry 34 compares the amplitude level of the signal waveform 42 to a predetermined threshold level or reference voltage. If the amplitude level of the signal waveform 42 exceeds the threshold, then a target is present and the comparison circuitry 34 issues a signal 44 to the control signal circuitry 36 that indicates a target is present. In response, the signal circuitry 36 outputs a control signal over the data bus 38 that shifts the operation of the data acquisition device 20 to the high-resolution mode (in order to determine if a target signature is present) and outputs control signals over the data bus 40 to configure all sonar sensors to the powered mode.

If the amplitude level of the signal waveform 42 is less than or equal to the predetermined threshold; then a target is not present and the comparison circuitry 34 outputs the signal 44. The signal 44 indicates a target is not present. In response, the control signal circuitry 36 outputs a control signal over the data bus 38 that maintains the data acquisition device 20 in the low-resolution mode and outputs control signals to maintain a predetermined number of sonar sensors 14 in the sleep mode.

In an alternate embodiment, the sonar sensor array 12 includes additional feedback circuitry to automatically adjust or vary the predetermined threshold level or reference voltage to account for variations in ambient noise levels. The sensor array 12 can include additional feedback circuitry to automatically adjust or vary the predetermined threshold level or reference voltage to account for variations in ambient noise level.

If the sensor array 12 is to be configured in the sleep mode; then the signal circuitry 36 outputs a control signal over the data bus 38 that configures the acquisition device 20 to the sleep mode and outputs control signals by the data bus 40 that configure all the sonar sensors 14 to the sleep mode.

If the system 10 is to be used in a slowly varying environment where a target of interest may be expected to appear; the circuitry 36 can be programmed to continuously cycle the acquisition device 20 between the sleep mode and the low-resolution mode at an appropriate rate and duty cycle. In such an embodiment, the circuitry 36 is programmed to periodically output control signals by the data bus 40 that powers a limited number of the sensors 14.

The energy detector 32 monitors for a pre-programmed increase in acoustic signal levels. The low-resolution mode processes the acoustic signals to determine if a target of interest is actually present. If a target is present, the circuit 30 automatically shifts the acquisition device 20 into the high-resolution mode to make a more precise measurement of the characteristics of the acoustic signals in order to determine if a known target signature is present.

In one embodiment, the circuit 30 is programmed to the acquisition device 20 so that the acquisition device cycles between the low-resolution and high-resolution modes without using the sleep mode. This embodiment is suited to environments that have slowly varying targets. The result is a maximum amount of relevant information being recorded but with a minimum of data volume.

Figure 2:
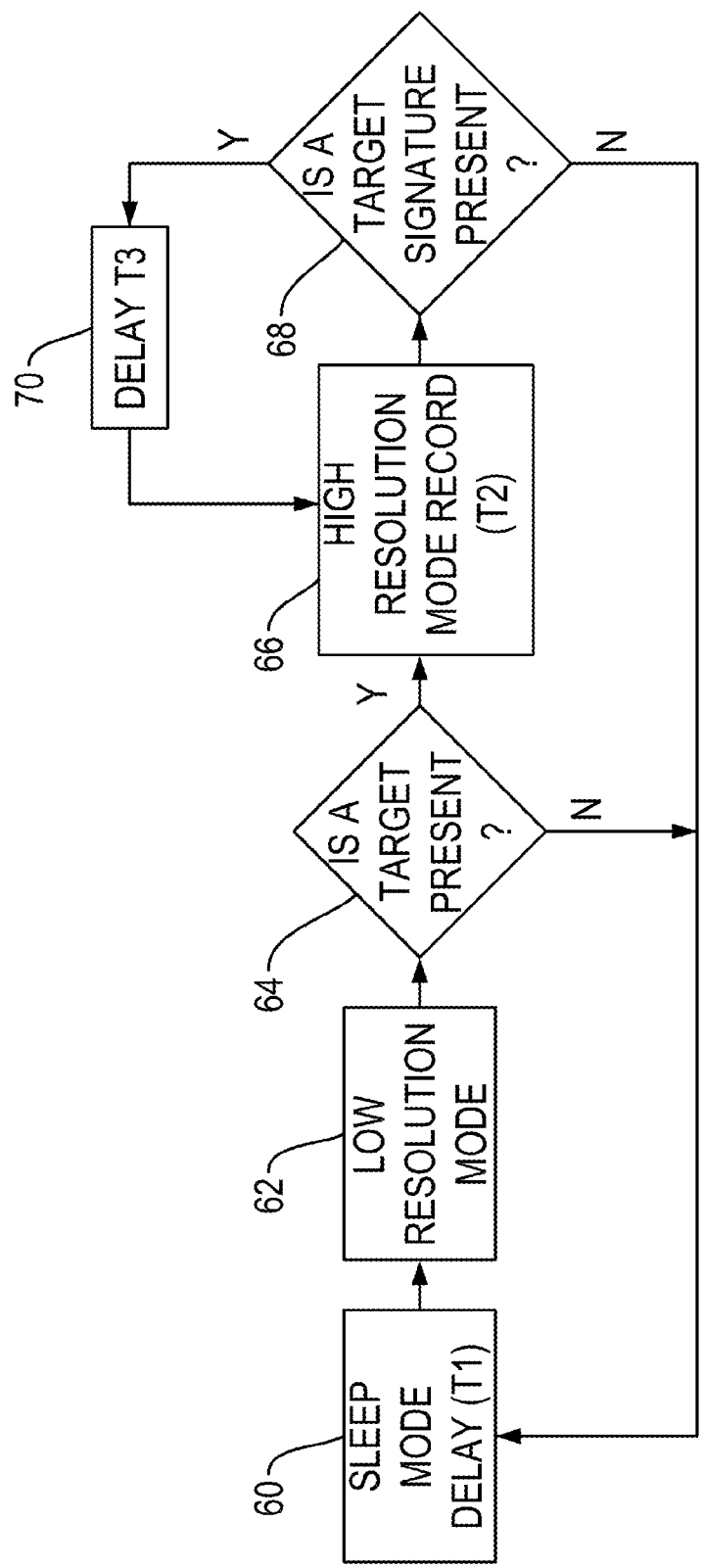
FIG. 2 is a flow chart of the operation of the sonar sensor array of FIG. 1 describing the relationship between the three modes of operation.

Referring to FIG. 2, there is shown a flow chart of the operation of the sonar sensor array 12 in accordance with the invention. As a reference point, the acquisition device 20 may be configured into the sleep mode numerous times during a period of operation (e.g., 24 hours, 48 hours, etc.). In step 60, all sonar sensors 14 and the data acquisition device 20 are in the sleep mode for a predetermined amount of time T1. Next, in step 62, after the time T1 elapses, the signal circuitry 36 issues a control signal to power a limited number of sonar sensors 14 and also issues a control signal to configure the acquisition device 20 to the low-resolution mode.

If the energy detector 32 detects acoustic signals from the powered sonar sensors 14; the low-resolution mode processes these signals to determine if a target of interest is present. In step 64, if it is determined that a target of interest is not present; then the circuitry 36 issues control signals that configure all the sonar sensors 14 and the data acquisition device 20 to the sleep mode. If in step 64, it is determined that a target is present, then in step 66, the circuitry 36 issues control signals to power all the sonar sensors 14 and to configure the data acquisition device 20 to the high-resolution mode for a predetermined amount of time T2. In the high-resolution mode, the acoustic signals received by the sonar sensors 14 are processed to determine if a target signature is present and then recorded. If in step 68, it is determined that a target signature is not present; the circuitry 36 issues control signals that configure all the sonar sensors 14 and the data acquisition device 20 to the sleep mode. If in step 68, it is determined that a target signature is present; then step 70 implements a predetermined time delay T3 and then returns to the high-resolution mode processing in step 66. The high-resolution mode processing will continue for another time segment T2. After the predetermined time segment T2 elapses; step 68 again determines if a target signature is still present.

If a target signature is still present, then step 70 initiates another time delay T3. Thus, steps 66, 68 and 70 form a loop that continues until a target signature is no longer present, in which case the control signal circuitry 36 will shift the data acquisition device 20 and the sonar sensors 14 back to the sleep mode. The circuitry 36 can be programmed to continuously cycle between the sleep mode and low-resolution mode until the low-resolution mode processing determines a target of interest is present. In such an embodiment, steps 60, 62 and 64 are repeated until step 64 determines that a target is present, in which case high-resolution processing is implemented.

The control signal circuitry 36 may be programmed to cycle the sonar array system 10 between the sleep mode and the high-resolution mode. This embodiment is suitable when there are targets of interest that are infrequent and slow moving. In this embodiment, the high-resolution mode is activated in an intermittent manner wherein data is recorded in short segments separated by time periods in which there is no data recording. This embodiment is useful in environments where there is a high signal-to-noise ratio. In such an embodiment, the circuitry 36 maintains the sonar array system 10 in the sleep mode for a predetermined amount of time and then is configured to the high-resolution mode for a predetermined amount of time.

If high-resolution mode processing detects a target signature; then the system 10 will enter the loop defined by steps 66, 68 and 70. If the high-resolution processing does not detect a target signature; the circuitry 36 configures the sonar sensors 14 and the data acquisition device 20 to the sleep mode. The control signal circuitry 36 will continue this pattern in accordance with a stored program of operation.

The present invention is significantly more efficient than prior art sonar array systems. FIG. 3 depicts an example of the differences in operation between a prior art legacy system and the sonar sensor array 14 for a twenty-four hour period. In the example, the circuitry 36 cycles the modes of operation between the low-resolution and high-resolution modes. In the legacy system: the system is operating constantly for twenty four hours; all channels (i.e., all sonar sensors) are constantly powered; the amplitude scale of measurement is always 24 bits; the bandwidth is constantly 500 Hz; the sample rate is constantly 1250 SPS (samples/second); the power consumption is 100% and the data rate is 40 KB/SEC (kilobytes per second). At the end of the operational period, the legacy system records 3398 MB of data. This inefficient performance is contrasted with the very efficient operation of the sonar sensor array 14. In this example, the sonar sensor array 14 is cycled between the low-resolution mode and the high-resolution mode. As apparent by the data shown in the figure, the low-resolution mode detects a suspected target ten times per day and the high-resolution mode is activated only for a ten-second period for each target detected during the low-resolution mode.

In this example, the sonar sensor array 14 is configured such that the sleep mode is not used and the control signal circuitry 36 cycles the operation between the low-resolution mode and high-resolution mode depending upon how many times the low-resolution mode detects a suspected target. As shown in FIG. 3, the low-resolution mode operates over a twenty-four hour period as does the legacy system, but the low-resolution mode operates at periodic intervals wherein the duration of each period of low-resolution processing is 100 seconds.

The low-resolution mode is implemented when the energy detector 32 detects acoustic signals from the powered sonar sensors 14. A reduced number of the sonar sensors 14 are utilized in the low-resolution mode which yields a 5:1 reduction in active channels. The amplitude scale of measurement is 8 bits, the bandwidth is 100 Hz and the sample rate is 250 SPS (samples per second). The power consumption in this mode is only ten percent of the power consumption of the prior art legacy system. The resulting data rate is 0.73 KB/SEC and the amount of data actually recorded is 61.7 MB. If the low-resolution mode determines there is a target; then the control circuit 30 shifts the signal processing function to the high-resolution mode.

In the high-resolution mode, all of the sonar sensors 14 are powered (all channels are active), the amplitude scale of measurement is 24 bits, the sample rate is 1250 SPS (samples/second) and the data rate is 40 KB/SEC. Although these operational characteristics are the same as the prior art legacy system; the high-resolution mode is implemented for periods of ten seconds for each target detected by low-resolution mode processing. In this example, ten targets are detected in a twenty-four hour period. This means high-resolution mode processing occurs for a total of 100 seconds in a twenty-four hour period. During each ten-second period in which high-resolution mode processing is implemented, the power consumption is 100% and the data rate is 40 KB/SEC. However, the total amount of data collected in the high-resolution mode is 3.9 MB. As a result of cycling between the low-resolution and high-resolution modes, only 65.6 MB of data is recorded and the total power consumption over a twenty-four hour period is 10.1% of the total power consumed by the legacy system over a twenty-four hour period.

In an alternate embodiment, the sonar sensor array 12 performs an initial spectral analysis of the acoustic signals detected by the sonar sensors 14 during low-resolution mode processing in order to confirm that high-resolution mode processing is warranted. In such an embodiment, the system 10 includes a spectrum analysis device that processes the acoustic signals received by the sonar sensors 14 and outputs a signal for input into the control circuit 30 wherein the signal indicates whether high-resolution mode signal processing is warranted.

The present invention provides many advantages and benefits. One advantage is a reduction in overall power consumption of the sonar sensor array 12; thereby, extending the lifetime of batteries. Another advantage is the significant reduction of the aggregate data bandwidth; thereby, resulting in relaxed data storage requirements and a decreased load on data processors or transmitters. Data having a low probability of containing signals of interest is either not recorded or is recorded at a reduced data rate; thereby, simplifying future data playback and processing tasks. As a result of the reduced amount of acquired data, lower bandwidth data-exfiltration techniques become viable.

In accordance with another embodiment of the invention, a preferred signal compression scheme is now presented which may be utilized by the sonar sensor array 12 as well as other acoustic signal detection and processing systems. This signal compression scheme compresses the dynamic range of acoustic signals digitized by a high-performance analog-to-digital converter (e.g., 24 bits) into 10 bits of amplitude without a loss of useful information.

Underwater acoustic signals can cover a wide dynamic range depending on local conditions such as ambient noise, merchant shipping, and the presence of active sonar. The instantaneous dynamic range requirement of underwater acoustic signals is typically much less than the total possible range of signal and noise levels. In particular, conditions of very large signals are accompanied by large background noise levels and likewise, very small signal levels are not detectable in the presence of large background noise levels, but are detectable with low ambient noise levels. In addition, the processing and display limits associated with beam-formed sonar arrays characteristically exhibit an additional limit on the useable instantaneous dynamic range in underwater acoustic systems. Specifically, large interfering signals in one direction will appear in the side lobes for beams pointing in other directions. Typical side lobes may only be 30 dB down, indicating a processing and display dynamic range of 30 dB. Some currently used sonar towed arrays utilizes 8-bit mu-Law data compression, which has at best approximately 40 dB of instantaneous dynamic range.

Conventional compression of amplitude-quantized data is typically accomplished with 8-bit mu-Law encoding. Ideal 8-bit mu-Law encoding typically provides about 78 dB of total dynamic range (based on a full scale of ±8031/2 counts) and about 40 dB of instantaneous dynamic range. Table 1 shows all 128 possible amplitude values for 8-bit mu-Law coding after expansion.

TABLE 1

| Steps | Chord 0<br>000 | 1<br>001 | 2<br>010 | 3<br>011 | 4<br>100 | 5<br>101 | 6<br>110 | 7<br>111 |
|---|---|---|---|---|---|---|---|---|
| 0 | 0000 | 0 | 33 | 99 | 231 | 495 | 1023 | 2079 | 4191 |
| 1 | 0001 | 2 | 37 | 107 | 247 | 527 | 1087 | 2207 | 4447 |
| 2 | 0010 | 4 | 41 | 115 | 263 | 559 | 1151 | 2335 | 4703 |
| 3 | 0011 | 6 | 45 | 123 | 279 | 591 | 1215 | 2463 | 4959 |
| 4 | 0100 | 8 | 49 | 131 | 295 | 623 | 1279 | 2591 | 5215 |
| 5 | 0101 | 10 | 53 | 139 | 311 | 655 | 1343 | 2719 | 5471 |
| 6 | 0110 | 12 | 57 | 147 | 327 | 687 | 1407 | 2847 | 5727 |
| 7 | 0111 | 14 | 61 | 155 | 343 | 719 | 1471 | 2975 | 5983 |
| 8 | 1000 | 16 | 65 | 163 | 359 | 751 | 1535 | 3103 | 6239 |
| 9 | 1001 | 18 | 69 | 171 | 375 | 783 | 1599 | 3231 | 6495 |
| 10 | 1010 | 20 | 73 | 179 | 391 | 815 | 1663 | 3359 | 6751 |
| 11 | 1011 | 22 | 77 | 187 | 407 | 847 | 1727 | 3487 | 7007 |
| 12 | 1100 | 24 | 81 | 195 | 423 | 879 | 1791 | 3615 | 7263 |
| 13 | 1101 | 26 | 85 | 203 | 439 | 911 | 1855 | 3743 | 7519 |
| 14 | 1110 | 28 | 89 | 211 | 455 | 943 | 1919 | 3871 | 7775 |
| 15 | 1111 | 30 | 93 | 219 | 471 | 975 | 1983 | 3999 | 8031 |

Figure 4:
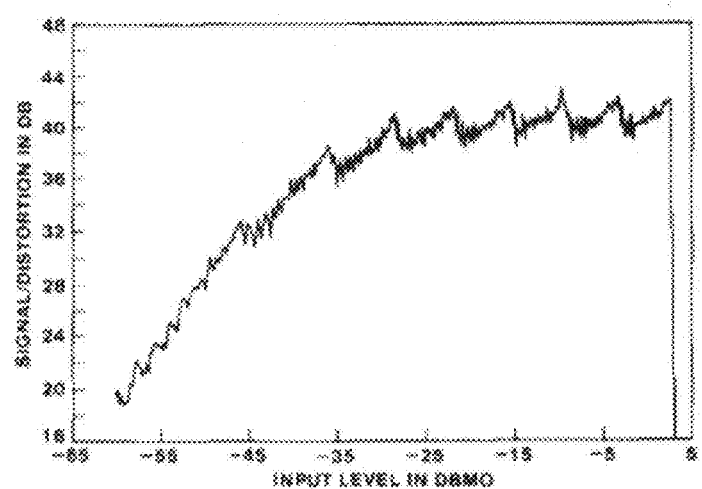
FIG. 4 is a graph of signal-to-noise ratio as a function of input level for prior art 8-bit mu-Law encoding.

An example of the 8-bit mu-Law encoding signal-to-noise ratio is shown in FIG. 4. This 8-bit mu-Law encoding technique converts 13 binary amplitude bits into 8 bits (1 sign bit, 3 exponent bits, and 4 amplitude bits) with logarithmically-scaled amplitude compression. Equations (1) and (2) show the expressions for determining the 3-bit chord (exponent) and 4-bit mantissa bits from a linear signal, where "ceil" represents rounding up to the nearest integer value and "$\log_2$" is the base-2 logarithm function. The reconstruction formula for 8-bit mu-Law is shown as Equation (3).

$$\text{chord} = \text{ceil}\left\{\log_2\left(\frac{|\text{signal}| + 33}{32}\right) - 1\right\} \quad (1)$$

$$\text{mantissa} = \text{ceil}\left\{\frac{|\text{signal}| - 2^{chord} \times 34 + 33}{2^{chord+1}}\right\} \quad (2)$$

$$\text{reconstruction} = \text{sign} \times 2^{chord} \times (2 \times \text{mantissa} + 33) - 33 \quad (3)$$

As described, the 8-bit mu-Law encoding scheme is similar to a linear conversion of 13 bits with 78 dB of dynamic range, which is suitable for passive sonar applications. However, the 8-bit mu-Law encoding scheme does not necessarily provide sufficient dynamic range to cover a broader range of underwater acoustics such as in active sonar applications.

Figure 5:
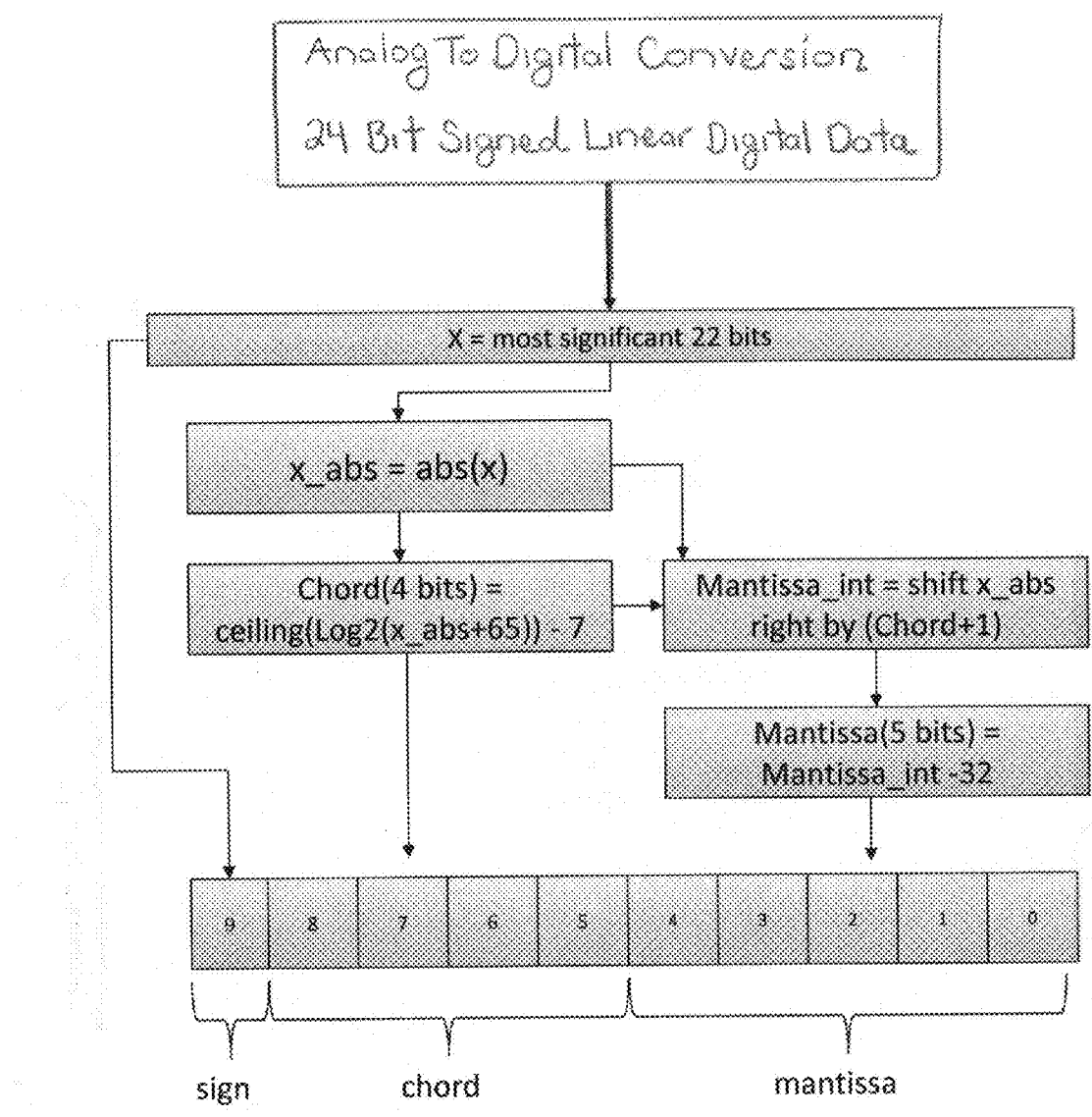
FIG. 5 is a flow chart illustrating the method for the 10-bit mu-Law encoding scheme in accordance with the present invention.

It has been found that compressing the dynamic range of acoustic signals digitized by a high-performance analog-to-digital converter (e.g., 24 bits) with a 10-bit mu-Law encoding scheme can provide sufficient dynamic range to cover a broader range of underwater acoustic signals without the loss of useful information. The flow chart shown in FIG. 5 illustrates the steps implemented in this 10-bit mu-Law encoding scheme. The digitized acoustic signals are provided by an analog-to-digital converter 102 (see FIG. 6) which is part of the signal processor 22. The digitized acoustic signals are in a 24-bit signed linear format and thus have 24 sign and amplitude bits. The 10-bit mu-Law encoding scheme codes the 24 sign and amplitude bits into 10 bits wherein the $10^{th}$ or most significant bit is the sign bit, bits 5-8 are the chord or exponent, and bits 0-4 are the mantissa or amplitude resulting in a theoretical 132 dB of useable dynamic range.

Equations (4) and (5) show the expressions for determining the 4 chord or exponent bits and the 5 mantissa or amplitude bits from a linear signal based on a full scale of ±4,128,867/2 counts. The reconstruction formula for 10-bit mu-Law is shown as Equation (6).

$$\text{chord} = \text{ceil}\left\{\log_2\left(\frac{|\text{signal}| + 65}{64}\right) - 1\right\} \quad (4)$$

$$\text{mantissa} = \text{ceil}\left\{\frac{|\text{signal}| - 2^{chord} \times 66 + 65}{2^{chord+1}}\right\} \quad (5)$$

$$\text{reconstruction} = \text{sign} \times 2^{chord} \times (2 \times \text{mantissa} + 66) - 65 \quad (6)$$

The 10-bit mu-Law encoding scheme increases the instantaneous dynamic range of the 8-bit mu-Law encoder by 6 dB due to an additional amplitude bit and increases the overall dynamic range by another 48 dB due to the additional exponent bit. Table 2 shows all 512 possible amplitude values for 10-bit mu-Law coding after expansion.

converter (ADC) 102, DC offset filter 104 and encoder 106 are part of the signal processor 22. The analog-to-digital converter 102 converts the detected acoustic signals 100 into a 24-bit digital data stream—indicated by reference number 108. The digital data stream 108 is then fed into the filter 104 which filters out any DC offset voltages that are present in the 24-bit digital data stream. The filtered 24-bit digital data stream, indicated by reference number 110, is then fed to the encoder 106 wherein the amplitude scale of measurement of the 24-bit digital data stream is compressed using a 10-bit mu-Law encoding scheme. Thus, the encoder 106 converts 24-bit linear to 10-bit mu-Law in accordance with the steps shown in FIG. 5.

The encoder 106 outputs a 10-bit digital data stream, indicated by reference number 112. The 10-bit digital data stream is then stored in the data storage device 24 by the data bus 26 (see FIG. 1) wherein the data stream is subsequently retrieved for post processing by signal expander 114 and signal processor 118. The signal expander 114 expands the compressed 10-bit digital data stream into an expanded digital data stream 120 having a predetermined signal format. The predetermined signal format is determined by the type of signal processing components that are being utilized and the needs of the users or operators.

Examples of such signal formats are 24-bit linear, 16-bit IEEE floating point-short and 32-bit IEEE floating point-long. The expanded digital data stream 120 is then inputted into the signal processor 118 which processes the expanded digital data stream to extract information about the target and outputs processed signals 122 which contain target information.

TABLE 2

| Steps | Chord 0<br>000 | 1<br>001 | 2<br>010 | 3<br>011 | 4<br>100 | 5<br>101 | 6<br>110 | 7<br>111 | 8<br>000 | 9<br>001 | 10<br>010 | 11<br>011 | 12<br>100 | 13<br>101 | 14<br>110 | 15<br>111 |
|---|---|---|---|---|---|---|---|---|---|---|---|---|---|---|---|---|
| 0 | 00000 | 0 | 65 | 195 | 455 | 975 | 2115 | 4195 | 8291 | 16483 | 32867 | 65635 | 131171 | 262243 | 524387 | 1048675 | 2097251 |
| 1 | 00001 | 2 | 69 | 203 | 471 | 1007 | 2179 | 4323 | 8547 | 16995 | 33891 | 67683 | 135267 | 270435 | 540771 | 1081443 | 2162787 |
| 2 | 00010 | 4 | 73 | 211 | 487 | 1039 | 2243 | 4451 | 8803 | 17507 | 34915 | 69731 | 139363 | 278627 | 557155 | 1114211 | 2228323 |
| 3 | 00011 | 6 | 77 | 219 | 503 | 1071 | 2307 | 4579 | 9059 | 18019 | 35939 | 71779 | 143459 | 286819 | 573539 | 1146979 | 2293859 |
| 4 | 00100 | 8 | 81 | 227 | 519 | 1103 | 2371 | 4707 | 9315 | 18531 | 36963 | 73827 | 147555 | 295011 | 589923 | 1179747 | 2359395 |
| 5 | 00101 | 10 | 85 | 235 | 535 | 1135 | 2435 | 4835 | 9571 | 19043 | 37987 | 75875 | 151651 | 303203 | 606307 | 1212515 | 2424931 |
| 6 | 00110 | 12 | 89 | 243 | 551 | 1167 | 2499 | 4963 | 9827 | 19555 | 39011 | 77923 | 155747 | 311395 | 622691 | 1245283 | 2490467 |
| 7 | 00111 | 14 | 93 | 251 | 567 | 1199 | 2563 | 5091 | 10083 | 20067 | 40035 | 79971 | 159843 | 319587 | 639075 | 1278051 | 2556003 |
| 8 | 01000 | 16 | 97 | 259 | 583 | 1231 | 2627 | 5219 | 10339 | 20579 | 41059 | 82019 | 163939 | 327779 | 655459 | 1310819 | 2621539 |
| 9 | 01001 | 18 | 101 | 267 | 599 | 1263 | 2691 | 5347 | 10595 | 21091 | 42083 | 84067 | 168035 | 335971 | 671843 | 1343587 | 2687075 |
| 10 | 01010 | 20 | 105 | 275 | 615 | 1295 | 2755 | 5475 | 10851 | 21603 | 43107 | 86115 | 172131 | 344163 | 688227 | 1376355 | 2752611 |
| 11 | 01011 | 22 | 109 | 283 | 631 | 1327 | 2819 | 5603 | 11107 | 22115 | 44131 | 88163 | 176227 | 352355 | 704611 | 1409123 | 2818147 |
| 12 | 01100 | 24 | 113 | 291 | 647 | 1359 | 2883 | 5731 | 11363 | 22627 | 45155 | 90211 | 180323 | 360547 | 720995 | 1441891 | 2883683 |
| 13 | 01101 | 26 | 117 | 299 | 663 | 1391 | 2947 | 5859 | 11619 | 23139 | 46179 | 92259 | 184419 | 368739 | 737379 | 1474659 | 2949219 |
| 14 | 01110 | 28 | 121 | 307 | 679 | 1423 | 3011 | 5987 | 11875 | 23651 | 47203 | 94307 | 188515 | 376931 | 753763 | 1507427 | 3014755 |
| 15 | 01111 | 30 | 125 | 315 | 695 | 1455 | 3075 | 6115 | 12131 | 24163 | 48227 | 96355 | 192611 | 385123 | 770147 | 1540195 | 3080291 |
| 16 | 10000 | 32 | 129 | 323 | 711 | 1487 | 3139 | 6243 | 12387 | 24675 | 49251 | 98403 | 196707 | 393315 | 786531 | 1572963 | 3145827 |
| 17 | 10001 | 34 | 133 | 331 | 727 | 1519 | 3203 | 6371 | 12643 | 25187 | 50275 | 100451 | 200803 | 401507 | 802915 | 1605731 | 3211363 |
| 18 | 10010 | 36 | 137 | 339 | 743 | 1551 | 3267 | 6499 | 12899 | 25699 | 51299 | 102499 | 204899 | 409699 | 819299 | 1638499 | 3276899 |
| 19 | 10011 | 38 | 141 | 347 | 759 | 1583 | 3331 | 6627 | 13155 | 26211 | 52323 | 104547 | 208995 | 417891 | 835683 | 1671267 | 3342435 |
| 20 | 10100 | 40 | 145 | 355 | 775 | 1615 | 3395 | 6755 | 13411 | 26723 | 53347 | 106595 | 213091 | 426083 | 852067 | 1704035 | 3407971 |
| 21 | 10101 | 42 | 149 | 363 | 791 | 1647 | 3459 | 6883 | 13667 | 27235 | 54371 | 108643 | 217187 | 434275 | 868451 | 1736803 | 3473507 |
| 22 | 10110 | 44 | 153 | 371 | 807 | 1679 | 3523 | 7011 | 13923 | 27747 | 55395 | 110691 | 221283 | 442467 | 884835 | 1769571 | 3539043 |
| 23 | 10111 | 46 | 157 | 379 | 823 | 1711 | 3587 | 7139 | 14179 | 28259 | 56419 | 112739 | 225379 | 450659 | 901219 | 1802339 | 3604579 |
| 24 | 11000 | 48 | 161 | 387 | 839 | 1743 | 3651 | 7267 | 14435 | 28771 | 57443 | 114787 | 229475 | 458851 | 917603 | 1835107 | 3670115 |
| 25 | 11001 | 50 | 165 | 395 | 855 | 1775 | 3715 | 7395 | 14691 | 29283 | 58467 | 116835 | 233571 | 467043 | 933987 | 1867875 | 3735651 |
| 26 | 11010 | 52 | 169 | 403 | 871 | 1807 | 3779 | 7523 | 14947 | 29795 | 59491 | 118883 | 237667 | 475235 | 950371 | 1900643 | 3801187 |
| 27 | 11011 | 54 | 173 | 411 | 887 | 1839 | 3843 | 7651 | 15203 | 30307 | 60515 | 120931 | 241763 | 483427 | 966755 | 1933411 | 3866723 |
| 28 | 11100 | 56 | 177 | 419 | 903 | 1871 | 3907 | 7779 | 15459 | 30819 | 61539 | 122979 | 245859 | 491619 | 983139 | 1966179 | 3932259 |
| 29 | 11101 | 58 | 181 | 427 | 919 | 1903 | 3971 | 7907 | 15715 | 31331 | 62563 | 125027 | 249955 | 499811 | 999523 | 1998947 | 3997795 |
| 30 | 11110 | 60 | 185 | 435 | 935 | 1935 | 4035 | 8035 | 15971 | 31843 | 63587 | 127075 | 254051 | 508003 | 1015907 | 2031715 | 4063331 |
| 31 | 11111 | 62 | 189 | 443 | 951 | 1967 | 4099 | 8163 | 16227 | 32355 | 64611 | 129123 | 258147 | 516195 | 1032291 | 2064483 | 4128867 |

Figure 6:
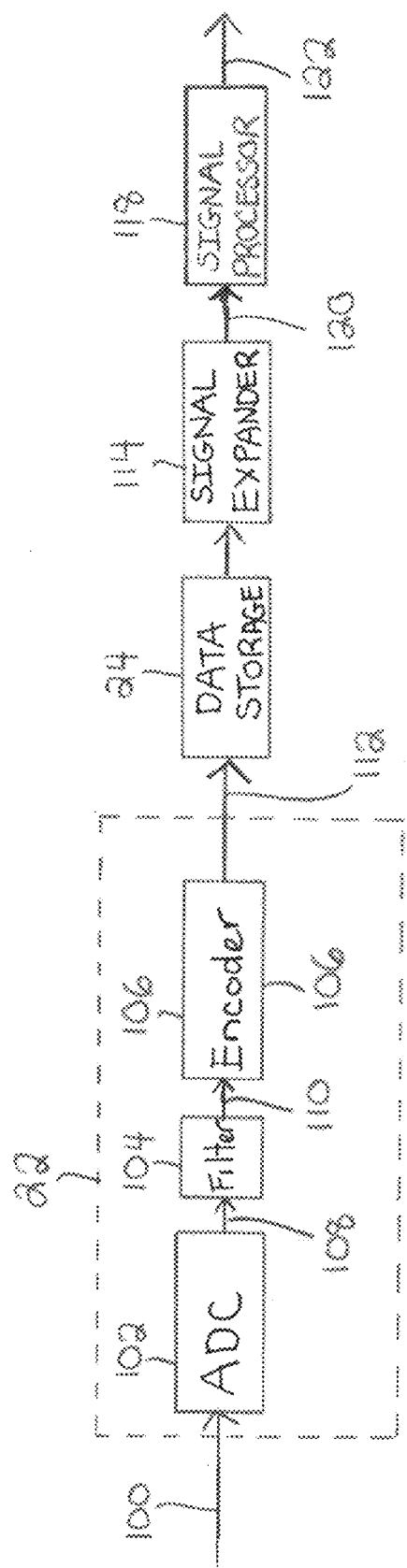
FIG. 6 is a block diagram of the signal processing components of the sonar sensor array of FIG. 1, in accordance with the present invention.

Referring to FIG. 6, detected acoustic signals 100 are provided by the sonar array 12 (see FIG. 1). The analog-to-digital A numerical simulation and analysis of the 10-bit mu-Law encoding scheme was performed in order to illustrate, in a qualitative manner, the significant advantages and characteristics of the 10-bit mu-Law compounding scheme in comparison to the industry standard 8-bit mu-Law compounding scheme, and to a 20-bit linear encoding scheme.

A mathematical model was created to first generate an input signal with a variable amplitude sine wave added to a constant spectral noise floor of −140 dB/Hz, which corresponds to an RMS noise floor of −113 dB after correcting for the 500-Hz noise bandwidth. This analysis shows an RMS dynamic range of 113 dB. The simulation was performed on full linear encoding, 8-bit mu-Law encoding, and on 10-bit mu-Law encoding. The ensuing simulations actually use 20-bit linear encoding rather than 24-bit linear encoding. The reason for this is that although commercially available, high-performance analog-to-digital converters provide 24-bits of amplitude resolution, the four lower order bits (i.e., 21-24 bits) represent added noise in the amplitude quantization process. The best performing analog-to-digital converters, suitable for sonar applications, exhibit approximately 20-bits of true amplitude quantization. Therefore, the ensuing simulations use 20-bit linear encoding. The results are shown in FIGS. 7A-L, which include the time domain and frequency domain analysis of a pure 83.7 Hz sine wave with: −120 dB additive noise for the three encoding schemes; 20-bit linear encoding, the industry standard 8-bit mu-Law encoding scheme after reconstruction; and the 10-bit mu-Law encoding after reconstruction. The time axis is a uniform 1000 samples per second.

FIGS. 7A, 7D, 7G and 7J show a segment of the 20-bit linear signal and an 8-bit mu-Law-encoded version. FIGS. 7B, 7E, 7H and 7K show a segment of the same 20-bit linear signal along with a 10-bit mu-Law-encoded signal. FIGS. 7C, 7F, 7I and 7L show the results of the Fourier analysis of the three types of signals. The data in FIGS. 7A-L corresponds to four signal amplitude levels. The data of FIGS. 7A, 7B and 7C corresponds to a full-scale sine wave.

The data of FIGS. 7D, 7E and 7F corresponds to a −30 dB sine wave relative to full scale. The data of FIGS. 7G, 7H and 7I corresponds to a −60 dB sine wave relative to full scale. The data of FIGS. 7J, 7K and 7L corresponds to a −90 dB sine wave relative to full scale. In each case, the input signal also includes the broadband random noise with a root mean square (RMS) level of −120 dB relative to full scale. A Fourier analysis of ten seconds of signal was analyzed using 1000 point fast Fourier transforms (FFTs) with a Kaiser window (beta=14 with −120 dB first side lobe) and no overlap. As shown by FIGS. 7B, 7E, 7H and 7K, the 10-bit mu-Law encoding tracks the original signal, even at a −90 dB input signal. FIGS. 7A, 7D, 7G and 7J compare the 20-bit linear signal to the industry standard 8-bit mu-Law signal. Significant deviation occurs at an input signal of −60 dB (see FIG. 7G) and the signal is absent at the −90 dB input signal level (see FIG. 7J). FIGS. 7C, 7F, 7I and 7L show how the quantization noise levels for the three coding types scale with signal level.

Referring to FIGS. 7A, 7D, 7G and 7J, the 20-bit linear signal is the trace with diamonds and the 8-bit mu-Law version is the trace with squares. In FIGS. 7A and 7D, the traces overlap. In FIG. 7G, there are periods in which both the 20-bit linear and the 8-bit mu-Law signals are distinguishable. In FIG. 7J, the trace for the 8-bit mu-Law is flat while the trace for the 20-bit linear signal is generally sinusoidal. In FIGS. 7B, 7E, 7H and 7K, the 20-bit linear signal is represented by the trace having the diamonds and the 10-bit mu-Law encoded signal is represented by the trace having the circles. The traces of the 20-bit signal and the 10-bit mu-Law encoded signal are virtually indistinguishable because the 10-bit mu-Law encoded signal virtually matches the trace of the 20-bit linear signal.

The signal traces shown in FIGS. 7C, 7F, 7I and 7L are shown in FIGS. 8A, 8B, 8C and 8D, respectively, with expansion of the portion of the frequency axis from 0.0 Hz to 200 Hz. The 20-bit linear signal is the lowermost trace and is indicated by reference number 300. The 8-bit mu-Law trace is indicated by reference number 302 and the 10-bit mu-Law trace is indicated by reference number 304. The sine wave signal levels relative to full scale used for generating these plots were 0 dB in FIG. 8A, −30 dB in FIG. 8B, −60 dB in FIG. 8C, and −90 dB in FIG. 8D.

FIGS. 8A and 8B show similar performance of noise floor between 8-bit mu-Law and 10-bit mu-Law with the 10-bit mu-Law signal displaying an expected noise level that is 6 dB lower than that of the 8-bit mu-Law signal. With a 60 dB down signal, the 8-bit mu-Law shows significant distortion with noise tonals across the band. With 90 dB down, there is no 8-bit mu-Law signal from which to compute a spectrum. The 10-bit mu-Law scheme maintains signal amplitude correctly and has a well behaved noise spectral density.

A simulation was performed of signal-to-noise ratio (SNR) as a function of signal level for the 8-bit mu-Law encoding, 10 bit mu-Law encoding and 20-bit linear encoding. The simulation includes the following parameters:
 a. A 140-Hz sine wave with amplitude stepped in increments of 0.5 dB from +120 dB to −20 dB.
 b. Amplitude-scaled random noise added to the sine wave at 60 dB below the sine level. This limits the possible SNR to 60 dB, which is more than sufficient for the passive sonar applications described previously.
 c. 2-kHz sample rate.
 d. 2000 point FFTs with 50% overlap.
 e. 4 seconds of data at each amplitude step.

Figure 9A:
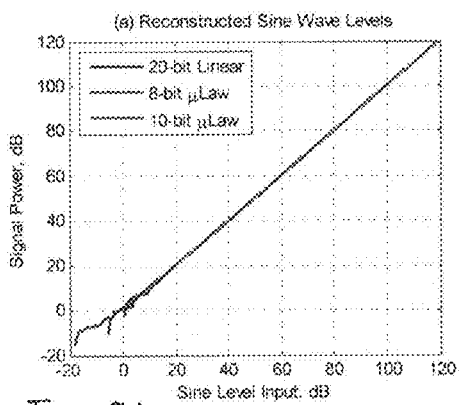
FIG. 9A is a graph showing a comparison between the input signal level power and reconstructed sine wave level for 20-bit linear encoding, 8-bit mu-Law encoding and 10-bit mu-Law encoding.
Figure 9B:
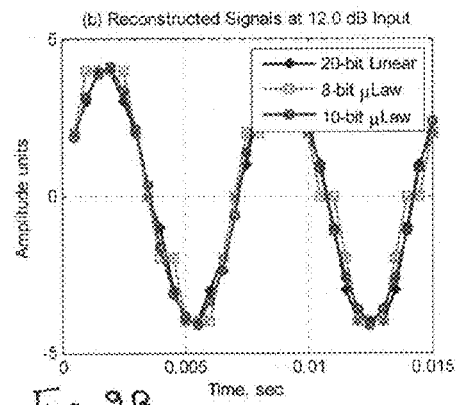
FIG. 9B is a graph showing reconstructed signal amplitudes at an input signal level of +12.0 for 20-bit linear encoding, 8-bit mu-Law encoding and 10-bit mu-Law encoding.

FIG. 9A shows a reconstructed sine wave amplitude versus input signal amplitude verifying that the three coding schemes reproduce the same levels when within their dynamic range envelope (the 20-bit linear has signal power from approximately −5 dB to +120 dB and the 8-bit mu-Law has signal power from approximately 0 dB to +78 dB). FIG. 9B shows a portion of the reconstructed signals with a sine wave input of +7.2 dB. In this plot, the data corresponding to the 10-bit mu-Law encoding is indicated by the trace having circles; the data corresponding to the 8-bit mu-Law encoding is indicated by the trace having the squares; and the data corresponding to the 20-bit linear encoding is indicated by the trace having diamonds. In this plot, the vertical units correspond to least significant bits for a 20-bit linear conversion. The 10-bit mu-Law encoding scheme has relatively more amplitude resolution than the 20-bit linear coding, which is consistent with the increased dynamic range.

Figure 9C:
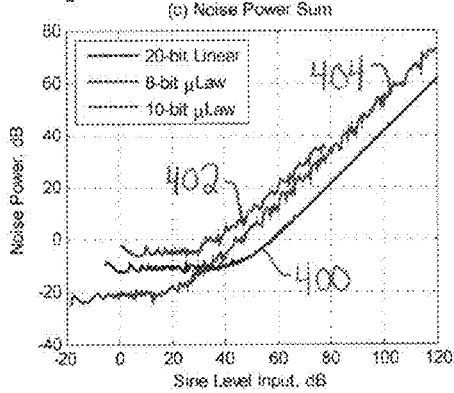
FIG. 9C is a graph showing noise power sum as a function of sine level input for 20-bit linear encoding, 8-bit mu-Law encoding and 10-bit mu-Law encoding which illustrates the much greater operational range of 10-bit mu-Law encoding as compared to 8-bit mu-Law encoding.

The curves in FIG. 9C show the total noise power that is formed by summing the spectral power bins from 10 to 130 Hz and 150 to 1000 Hz. This process adds the quantization noise, added input noise, plus the harmonics. In examining the noise from the 20-bit linear encoding, indicated by reference number 400, the noise peaks at +60 dB at the right side of the plot and drops linearly with decreasing input signal level. This characteristic is due to the addition of scaled random noise at 60 dB below the fundamental sine wave at 140 Hz. At an input signal level of about +40 dB; the 20-bit linear noise plateaus at a level of about −11 dB. The curve for the 8-bit mu-Law encoder noise is indicated by reference number 402. The 8-bit mu-Law encoder noise plateaus at about −4 dB. The curve for the 10-bit mu-Law encoder noise is indicated by reference number 404. The 10-bit mu-Law noise plateaus at about −11 dB. These noise plateaus are primarily due to harmonic-related tonals of the input sine wave.

Figure 9D:
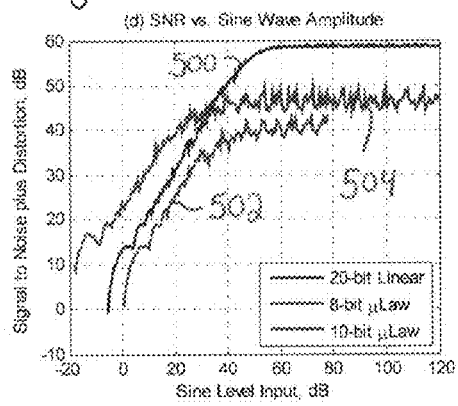
FIG. 9D is a graph showing signal-to-noise ratio (SNR) as a function of sine level input for 20-bit linear encoding, 8-bit mu-Law encoding and 10-bit mu-Law encoding which illustrates the much greater operational range of 10-bit mu-Law encoding as compared to 8-bit mu-Law encoding.

The curves in FIG. 9D show the ratio of signal level from FIG. 9A to noise plus distortion level from FIG. 9C. Above approximately 40 dB input, the 10-bit mu-Law encoder has 6 dB more dynamic range than the 8-bit mu-Law version. In FIG. 9D, the curve corresponding to 20-bit linear encoding is indicated by reference number 500; the curve corresponding to 8-bit mu-Law encoding is indicated by reference number 502; and the curve corresponding to the 10-bit mu-Law encoding is indicated by reference number 504. The advantages of 10 bit mu-Law encoding are evident in the 40 dB of additional maximum signal capability, the +6 dB of additional SNR over the 8-bit conversion, and relatively better performance than the 20-bit linear below approximately a '+' 30 dB signal level. In order to take full advantage of the dynamic range capability of 10-bit mu-Law encoding; it is preferable that a relatively lower noise preamplifier and additional levels of adjustable gain prior to the analog-to-digital converter are utilized.

The operational amplifiers used for gain and for providing balanced input into the analog-to-digital converter typically have an input offset voltage between approximately 1 mV and 5 mV.

Figure 10:
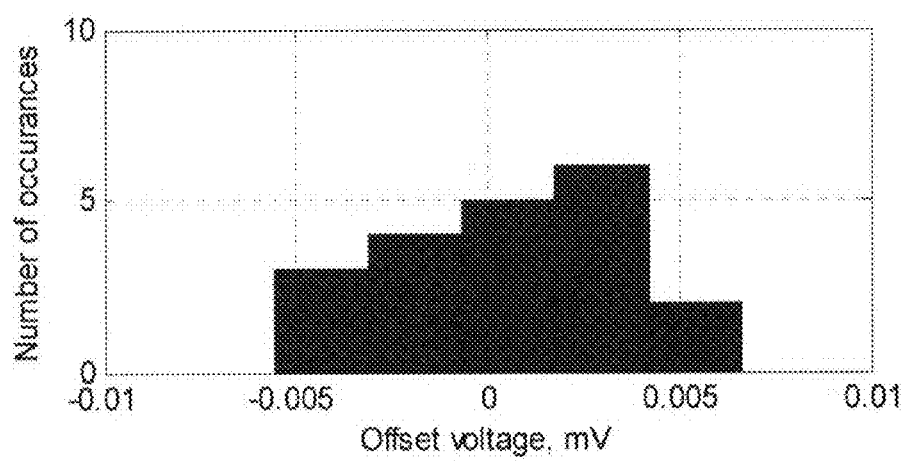
FIG. 10 is a graph of the input offset voltage for a typical of the analog-to-digital converter illustrating the need for employing a high pass filter prior to mu-Law encoding.

Although this offset voltage does not cause problems for linear analog-to-digital conversion operation, the voltage can invalidate the mu-Law conversion algorithm by adding a bias that is larger than small value signal inputs into the analog-to-digital converter. FIG. 10 shows a histogram of DC offset voltage levels for 20 channels in a test harness. Offset voltages varied from −5.2 to +6.6 millivolts (mV) with a mean offset voltage level of 0.54 mV. By comparison, for the case where the analog-to-digital converter full scale is 2 volts, bit levels in the 000 chord correspond to approximately 1 microvolt step size. Therefore, in order to resolve this issue, a single digital high-pass filter is used to remove the DC offset voltages. It has been found that a single pole, infinite impulse response (IIR) filter of 1 Hz-3 Hz is suitable for removing the DC offset voltages. In FIG. 6, filter 104 is configured as a digital high-pass filter.

Figure 11:
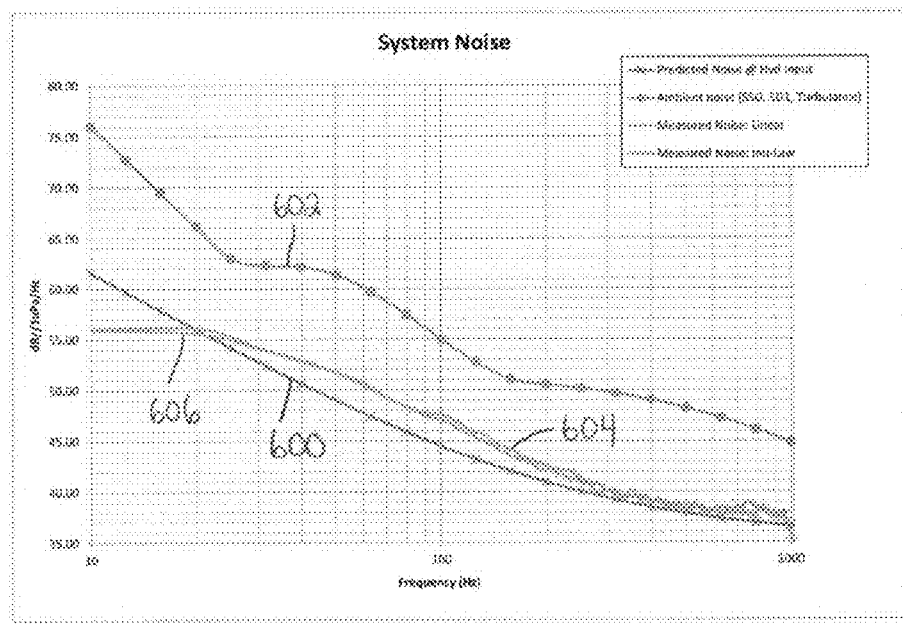
FIG. 11 is a graph of sound pressure spectral density versus frequency showing (1) a reference ambient noise level, (2) the predicted system electronic noise level, and (3) and (4) demonstrating that the measured mu-law compression noise spectral density is equivalent to the noise level for uncompressed signals using linear encoding.

Measurements were made on a prototype implementation of a sonar channel built according to the invention and Fourier analysis was performed on these measurements to determine the frequency domain characteristics of residual system noise. FIG. 11 shows the predicted noise level for this implementation using known hydrophone and electronic parameters 600 (reference T. B. Straw, 'Noise Prediction for Hydrophone/Preamplifier Systems', NUWC-NPT Technical Report 10,369 2 Jun. 1993). Signals were sampled and quantized using a 24 bit analog-to-digital converter and the results were processed using Fourier techniques resulting in the noise curve verses frequency for linear encoding 604, and using the 10 bit mu-law encoding technique described herein 606 demonstrating an equivalent noise floor performance. The deviation from prediction below 30 Hz is due to an analog high pass filter prior to the analog-to-digital converter. If this high pass filter had been compensated for, both the linear noise 604 and mu-Law noise 606 would closely match the predicted noise 600.

For completeness, FIG. 11 includes a plot a typical minimum ambient acoustic noise level 602 in the ocean of Sea State Zero, Shipping Level One and Low Frequency Ocean Turbulence. (reference W. Sadowski and R. Katz, 'Ambient Noise Standards for Acoustic Modeling and Analysis', NUWC Technical Document 7265, 3 Aug. 1984).

It will be understood that many additional changes in the details, materials, steps and arrangement of parts, which have been herein described and illustrated in order to explain the nature of the invention, may be made by those skilled in the art within the principle and scope of the invention as expressed in the appended claims.

The foregoing description of the preferred embodiments of the invention has been presented for purposes of illustration and description only. It is not intended to be exhaustive nor to limit the invention to the precise form disclosed; and obviously many modifications and variations are possible in light of the above teaching. Such modifications and variations that may be apparent to a person skilled in the art are intended to be included within the scope of this invention as defined by the accompanying claims.

What is claimed is:

1. A method of processing acoustic signals, said method comprising the steps of:
   providing acoustic signals from a sonar sensor array;
   sampling the provided acoustic signals at a sample rate to produce sampled acoustic signals;
   digitizing the sampled acoustic signals with an analog-to-digital converter to produce digitized acoustic signals having a first predetermined format and a first amplitude scale of measurement; and
   compressing the digitized acoustic signals with a 10 bit mu-Law encoding scheme to produce compressed signals having a second amplitude scale of measurement.

2. The method according to claim 1 wherein the first predetermined format is 24 bit linear.

3. The method according to claim 1 further comprising the step of expanding the compressed signals to produce expanded digital signals having a second predetermined format.

4. The method according to claim 3 wherein the second predetermined format is chosen from the group comprising 24 bit linear, 16 bit IEEE floating point-short, and 32 bit IEEE floating point-long.

5. The method according to claim 3 further comprising the step of processing the expanded digital signals to extract target information.

6. The method according to claim 1 further comprising the step of, prior to compressing the digitized acoustic signals, filtering out Direct Current offset voltages from the digitized acoustic signals.

7. The method according to claim 1 wherein said step of providing the acoustic signals comprises the step of detecting the acoustic signals.

8. The method according to claim 7 wherein said step of detecting the acoustic signals comprises the step of utilizing a sonar array to detect the acoustic signals.

9. An acoustic signal processing system, comprising:
   at least one sensor for detecting acoustic signals;
   an analog-to-digital converter for sampling the detected acoustic signals at a sample rate to produce sampled acoustic signals and digitizing the sampled acoustic signals to produce digitized signals having a predetermined format and a first amplitude scale of measurement; and
   a signal compressor for compressing the digitized signals with a 10 bit mu-Law encoding scheme to produce compressed digitized signals having a second amplitude scale of measurement.

10. The signal processing system according to claim 9 wherein the predetermined format of the digitized signals provided by said analog-to-digital converter is 24 bit linear.

11. The signal processing system according to claim 9 further comprising a signal expander for expanding the compressed digitized signals to produce expanded digitized signals.

12. The signal processing system according to claim 11 wherein the expanded digitized signals have a format chosen from the group comprising 24 bit linear, 16 bit IEEE floating point-short, and 32 bit IEEE floating point-long.

13. The signal processing system according to claim 11 further comprising a signal processor for processing the expanded digitized signals in order to extract target information.

14. The signal processing system according to claim 9 further comprising a filter for filtering out the Direct Current offset voltages prior to compressing the digitized acoustic signals.

15. A sonar signal processing system, comprising:
- a plurality of sonar sensors, wherein each sensor can be configured to a powered mode to detect acoustic signals and to a sleep mode in which said sensor receives no power and does not detect acoustic signals; and
- a data acquisition device comprising an analog-to-digital conversion resource configured to sample and digitize the acoustic signals received by said sonar sensors at full dynamic range so to produce digitized acoustic signals in a predetermined format having a first amplitude scale of measurement, and a digital signal compression resource configured to compress the digitized acoustic signals with a 10 mu-bit Law encoding scheme to produce compressed digitized acoustic signals having a second amplitude scale of measurement, wherein said data acquisition device has a high-resolution mode of operation in which said data acquisition device outputs digitized acoustic signals in the predetermined format having the first amplitude scale of measurement and a low resolution mode of operation in which said data acquisition device outputs the compressed digitized acoustic signals having the second amplitude scale of measurement; and
- a control circuit to configure said plurality of sonar sensors to the sleep mode and to the powered mode and to configure the data acquisition device to the low-resolution mode or to the high-resolution mode depending upon the amplitude level of the detected acoustic signals and whether the detected acoustic signals indicate a target.

16. The system according to claim 15 wherein said control circuit comprises an energy detector to detect the detected acoustic signals and to output a signal waveform representing the detected acoustic signals.

17. The system according to claim 16 wherein said control circuit further comprises circuitry to determine an amplitude level of the signal waveform and to compare the amplitude level to a predetermined threshold, and wherein said control circuit is capable of configuring said data acquisition device to the low-resolution mode and a predetermined number of sonar sensors to the sleep mode if the amplitude level is less than the predetermined threshold and to the high-resolution mode and said sensors to the powered mode if the amplitude level is greater than the predetermined threshold.

18. The system according to claim 15 further comprising a signal expander capable of expanding the compressed signals to expanded digital signals having a predetermined format.

19. The system according to claim 18 further comprising a signal processing resource capable of processing the expanded signal to extract target information.

20. The system according to claim 15 further comprising a filter to filter out DC offset voltages from the digitized acoustic signals provided by said analog-to-digital conversion resource.

* * * * *